United States Patent
Noro et al.

(10) Patent No.: US 10,622,542 B2
(45) Date of Patent: Apr. 14, 2020

(54) STACKED PIEZOELECTRIC CERAMIC ELEMENT

(71) Applicant: WISOL CO., LTD., Gyeonggi-do (KR)

(72) Inventors: Yukihiro Noro, Gyeonggi-do (KR); Jae Hyung Choi, Gyeonggi-do (KR); Yo Sep Choi, Gyeonggi-do (KR); Jung Rae Noh, Gyeonggi-do (KR); Hye Jin Choi, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 494 days.

(21) Appl. No.: 15/506,984

(22) PCT Filed: Aug. 29, 2014

(86) PCT No.: PCT/KR2014/008066
§ 371 (c)(1),
(2) Date: Feb. 27, 2017

(87) PCT Pub. No.: WO2016/032029
PCT Pub. Date: Mar. 3, 2016

(65) Prior Publication Data
US 2017/0288124 A1    Oct. 5, 2017

(30) Foreign Application Priority Data
Aug. 29, 2014    (KR) .................. 10-2014-0113896

(51) Int. Cl.
*H01L 41/083*    (2006.01)
*H01L 41/047*    (2006.01)
(Continued)

(52) U.S. Cl.
CPC ........ *H01L 41/083* (2013.01); *H01L 41/0477* (2013.01); *H01L 41/0533* (2013.01);
(Continued)

(58) Field of Classification Search
CPC .............. H01L 41/083; H01L 41/0477; H01L 41/0533; H01L 41/1876; H01L 41/273; H01L 41/277
(Continued)

(56) References Cited

U.S. PATENT DOCUMENTS 5,182,695 A * 1/1993 Handa .................. C04B 35/497
361/321.5
5,684,884 A * 11/1997 Nakaya .................. H04R 17/00
310/322
(Continued)

FOREIGN PATENT DOCUMENTS

JP    08-119771    5/1996
JP    2901687    6/1999
(Continued)

OTHER PUBLICATIONS

International Search Report (ISR) dated May 11, 2015 in PCT/KR2016/008066 with English translation.

*Primary Examiner* — Thomas M Dougherty
(74) *Attorney, Agent, or Firm* — Harness, Dickey & Pierce, P.L.C.

(57) ABSTRACT

The present invention relates to a stacked piezoelectric ceramic element and can provide a stacked piezoelectric ceramic element produced by stacking two or more ceramic green sheets, the stacked piezoelectric ceramic element having a structure in which a ceramic porous or defective part constituting the stacked piezoelectric ceramic element is impregnated with an organic resin, thereby improving waterproof performance capable of preventing the deterioration of insulation resistance in a highly humid environment.

5 Claims, 5 Drawing Sheets

(51) Int. Cl.
*H01L 41/187* (2006.01)
*H01L 41/273* (2013.01)
*H01L 41/053* (2006.01)
*H01L 41/277* (2013.01)

(52) U.S. Cl.
CPC ........ *H01L 41/1876* (2013.01); *H01L 41/273* (2013.01); *H01L 41/277* (2013.01)

(58) Field of Classification Search
USPC ........................................................ 310/358
See application file for complete search history.

(56) References Cited

U.S. PATENT DOCUMENTS

| | | | |
|---|---|---|---|
| 7,467,558 B2 | 12/2008 | Fukuda et al. | ............. 73/862.68 |
| 2006/0055288 A1* | 3/2006 | Heinzmann | ......... H01L 41/0472 |
| | | | 310/364 |

FOREIGN PATENT DOCUMENTS

| | | |
|---|---|---|
| JP | 2007-012867 | 1/2007 |
| KR | 10-2006-0086355 | 7/2006 |

* cited by examiner

STACKED PIEZOELECTRIC CERAMIC ELEMENT

CROSS-REFERENCE TO RELATED APPLICATIONS

This application is a national phase application of PCT Application No. PCT/KR2014/008066, filed on 29 Aug. 2014, which claims benefit of Korean Patent Application 10-2014-0113896, filed on 29 Aug. 2014. The entire disclosure of the applications identified in this paragraph are incorporated herein by reference.

FIELD

The present invention relates to a stacked piezoelectric ceramic element, and more particularly, to a stacked piezoelectric ceramic element including a plurality of dummy ceramic layers that cover an uppermost portion and a lowermost portion of an actuator ceramic stack body and are formed of a ceramic porous body and has improved waterproofing performance capable of preventing deterioration of insulation resistance in a high humidity environment by impregnating with an organic insulating resin solution.

BACKGROUND

Recently, as industrial technologies have developed, ceramic materials without conduction electrons and having insulation for insulating electricity and heat and stability in strong coupling to have a high melting point and chemical stability are used as electronic materials in various ways.

Particularly, ceramic materials are generally used as piezoelectric materials that output electricity when receiving pressure or deform when receiving electricity.

A piezoelectric ceramic technology described above indicates a technology of forming a module that generates electricity when a physical pressure is applied thereto, with a ceramic element. Here, a piezoelectric element indicates an element having properties capable of mutually converting electrical energy and mechanical energy.

Here, in the piezoelectric element, a voltage is generated by a force applied to piezoelectric ceramic and a level of the generated voltage changes according to the intensity of the force.

Also, it is known that a piezoelectric ceramic element described above has properties of precisely controlling a displacement with high responsibility and a stacked piezoelectric ceramic element is able to obtain a high displacement using a small voltage.

Due to a reason as described above, stacked piezoelectric ceramic elements are generally applied to and used for an injector, a micro pump, an inkjet head, and a speaker.

General stacked piezoelectric ceramic elements have a structure in which an actuator stacking body having a structure in which a piezoelectric actuator ceramic layer and an internal electrode are alternately stacked is formed and an external electrode is formed on an uppermost layer, a lowermost layer, or a side of the stacking body.

Meanwhile, in the case of stacked piezoelectric ceramic elements, various technologies are applied to prevent insulation deterioration or insulation breakdown in a high temperature and high humidity environment.

Particularly, when micro cracks occur at the internal electrode for polarization that forms the actuator stacking body, humidity penetrates the same and insulation deterioration or insulation breakdown occurs.

To solve problems described above, hitherto, there was a technology for suppressing water penetration by forming a moisture-proofing layer therein or surrounding the internal electrode for polarization and a piezoelectric ceramic layer with inorganic materials.

However, a general technology of forming a moisture-proofing film inside a stacked piezoelectric ceramic element has a difficulty in being applied to products including an internal electrode for polarization with a large area, and a technology of suppressing water permeation by protecting an internal electrode for polarization and a piezoelectric ceramic layer has a problem in which a driving force of an actuator is deteriorated because an adequate thickness of inorganic materials is necessary.

Accordingly, a practical and applicable technology with respect to a piezoelectric ceramic element capable of preventing deterioration of insulation resistance and deterioration of a driving force in a high humidity environment is acutely required.

DISCLOSURE OF INVENTION

Technical Problem

Therefore, it is an aspect of the present invention to provide a stacked piezoelectric ceramic element including a plurality of dummy ceramic layers that cover an uppermost portion and a lowermost portion of an actuator ceramic stack body and are formed of a ceramic porous body and has improved waterproofing performance capable of preventing deterioration of insulation resistance in a high humidity environment by impregnating with an organic insulating resin solution.

Technical Solution

One aspect of the present invention provides a stacked piezoelectric ceramic element with improved waterproofing performance manufactured by stacking two or more ceramic green sheets, including a structure in which one of a pore part and a defective part of ceramic forming the stacked piezoelectric ceramic element is impregnated with an organic resin, in which an organic insulating resin is contained and a waterproof-coating layer is formed around internal electrodes.

The stacked piezoelectric ceramic element with improved waterproofing performance may include an actuator ceramic stack body including a plurality of actuator ceramic layers formed between internal electrodes or an internal electrode and an external electrode and a dummy ceramic layer that covers one or more surfaces of top, bottom, and both sides of the actuator ceramic stack body. Here, a porosity of the dummy ceramic layer may be within a range of 0.5% to 5.0%.

The stacked piezoelectric ceramic element with improved waterproofing performance may have a process of removing the organic resin attached to the surface of the stacked piezoelectric ceramic element.

The stacked piezoelectric ceramic element with improved waterproofing performance may be adhered to a diaphragm formed of one material of metal, organic, and inorganic materials.

The internal electrode and the external electrode may be formed one of Ag and Ag/Pd materials.

The actuator ceramic layer may be formed of piezoelectric ceramic material including PZT-based material.

The stacked piezoelectric ceramic element with improved waterproofing performance may have a process of vacuum-impregnating or pressurization-impregnating with the organic resin.

Advantageous Effects

As described above, according to the present invention, there is provided an effect of providing a stacked piezoelectric ceramic element capable of preventing deterioration of insulation resistance in a high humidity environment by preventing water permeation into internal electrodes using a structure in which pores forming dummy ceramic layers are impregnated with an organic insulating resin by impregnating the stacked piezoelectric ceramic element with an organic insulating resin solution such as a silicone.

Also, according to the present invention, since it is possible to control a porosity using a method of forming a dummy ceramic green sheet using ceramic piezoelectric materials having a higher sintering temperature than that of an actuator ceramic green sheet, there is provided an effect of easily manufacturing a stacked piezoelectric ceramic element having high waterproofing effect.

Also, according to the present invention, even though an inorganic insulting resin coating layer formed on the surface a stacked piezoelectric ceramic element is removed in an impregnation process thereof, since an organic insulating resin is contained in pores of a ceramic porous body forming a ceramic layer, there is an effect of providing the stacked piezoelectric ceramic element capable of easily coming into contact with a diaphragm and preventing deterioration of waterproofing performance.

BEST MODE

A stacked piezoelectric ceramic element with improved waterproofing performance according to the present invention relates to a stacked piezoelectric ceramic element manufactured by stacking two or more ceramic green sheets and may be applied to a piezoelectric speaker by coupling one surface with a diaphragm for amplifying vibrations generated by the stacked piezoelectric ceramic element.

Here, the diaphragm may use a metal material, an inorganic material such as polymers, and an organic material such as pulp and the like.

Hereinafter, exemplary embodiments of the present invention will be described in detail with reference to the attached drawings.

Figure 1:
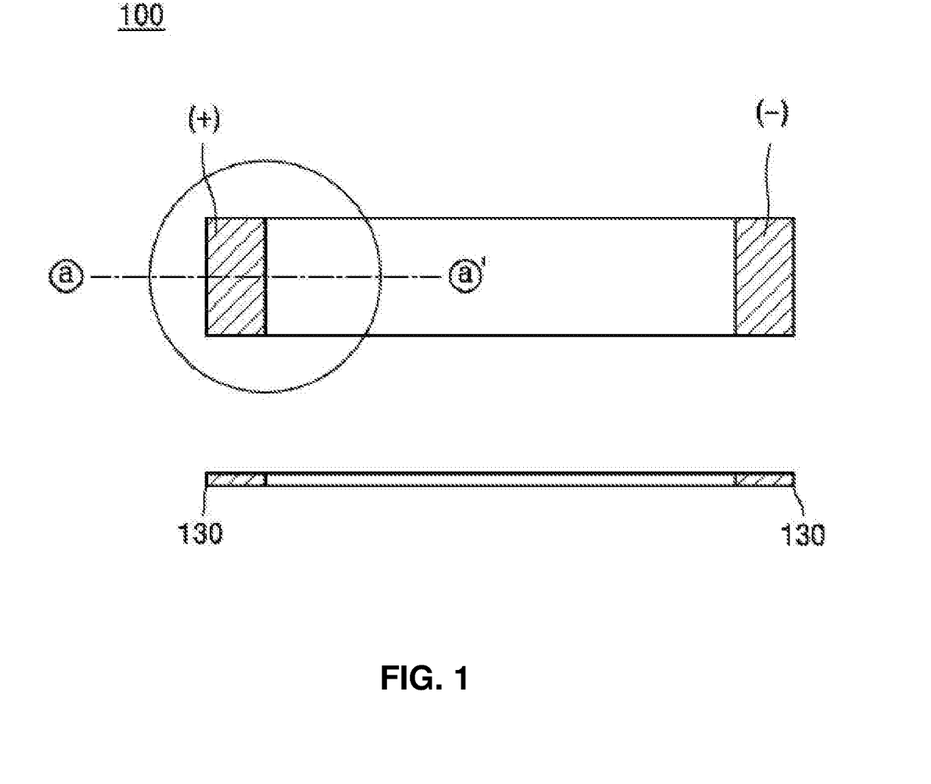
FIG. 1 illustrates a top view and a side view of a stacked piezoelectric ceramic element with improved waterproofing performance according to one embodiment of the present invention.
Figure 2:
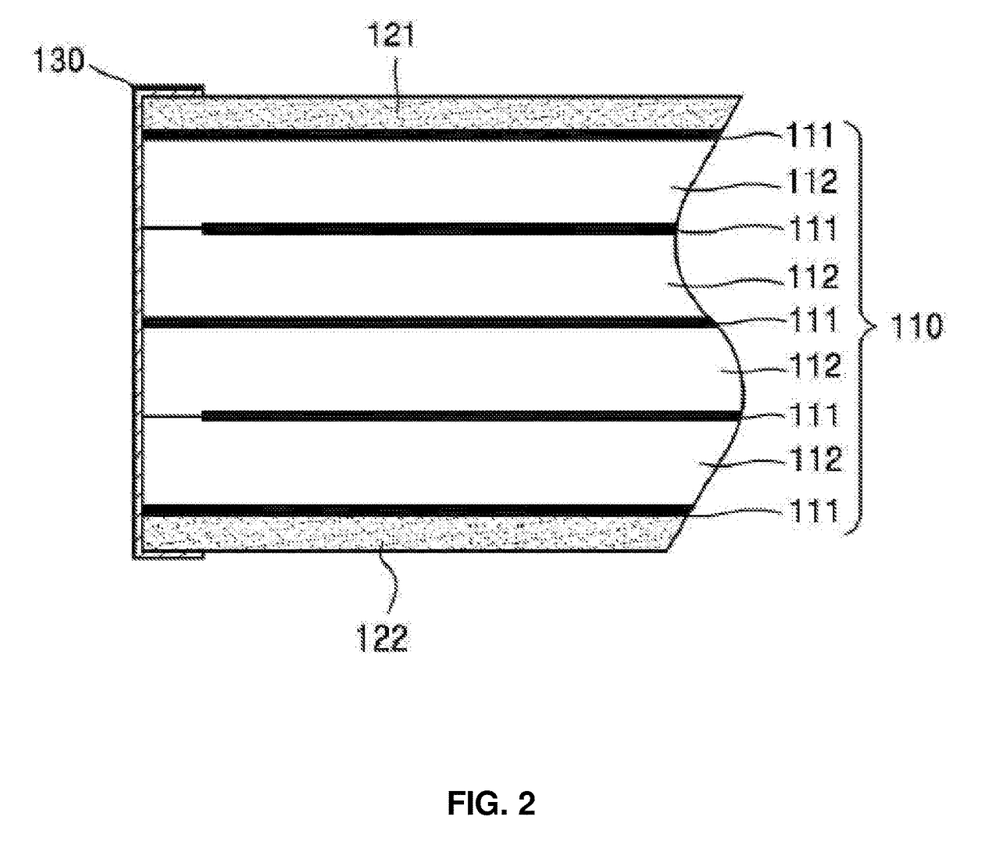
FIG. 2 is a view illustrating a cross section of a-a' shown in FIG. 1.

FIG. 1 illustrates a top view and a side view of a stacked piezoelectric ceramic element with improved water-proofing performance according to one embodiment of the present invention, and FIG. 2 is a view illustrating a cross section of a-a' shown in FIG. 1.

As shown in the drawings, a stacked piezoelectric ceramic element 100 with improved waterproofing performance according to one embodiment of the present invention may include an actuator ceramic stack body 110, a plurality of dummy ceramic layers 120, and a plurality of external electrodes 130.

In more detail, the actuator ceramic stack body 110 may include a plurality of internal electrodes 111 formed by printing two or more ceramic green sheets and a plurality of actuator ceramic layers 112 formed between the plurality of internal electrodes 111 to electrically separate the plurality of internal electrodes.

Here, the internal electrodes 111 may be formed of silver (Ag) or silver-palladium (Ag—Pd) electrode materials and the plurality of actuator ceramic layers 112 may be manufactured using PZT-PNN-based piezoelectric ceramic materials.

Also, the actuator ceramic layers 112, as shown in the cross-sectional view of FIG. 2, may include parts at which the internal electrodes 111 are formed and parts without the internal electrodes 111. The internal electrodes disposed on a central part and outside an uppermost layer and a lowermost layer may be formed overall on a contact surface of an adjacent actuator ceramic layer.

The plurality of dummy ceramic layers 120 may be arranged in a structure that covers an uppermost part and a lowermost part of the actuator ceramic stack body 110 while each one surface is exposed to the air, may primarily block water that flows into the actuator ceramic layers 112, and may be formed of a ceramic porous body having a higher porosity than that of the actuator ceramic layers 112.

Here, the porosity of the ceramic porous body that forms the plurality of dummy ceramic layers may be present within a range from 0.5 to 5.0%. For this, the porosity may be controlled using piezoelectric ceramic materials having a relatively higher sintering temperature that that of the actuator ceramic layers 112 that form the actuator ceramic stack body 110.

For example, in the embodiment of the present invention, it is possible to control a porosity of ceramic layers formed of a porous body by using ceramic materials having a sintering temperature of 1,050° C. for forming the actuator ceramic layers 112 and ceramic materials having a sintering temperature of 1,000° C. for forming the dummy ceramic layers 120.

As described above, the stacked piezoelectric ceramic element with improved waterproofing performance according to one embodiment include a plurality of dummy ceramic layers that cover an uppermost part and a lowermost part of an actuator ceramic stack body and are formed of a ceramic porous body to prevent water from easily penetrating the stacked piezoelectric ceramic element.

The external electrodes 130, as shown in the cross-sectional view of FIG. 2, may be formed at ends of both sides opposite each other in a vertical direction, and both ends of each thereof, as shown in the top view and the side view of FIG. 1, may be formed in a structure of being disposed at outer edges of the plurality of dummy ceramic layers 120.

In the embodiment of the present invention, the external electrodes 130 are arranged outside the actuator ceramic stack body 110 to perform a function of receiving power applied from the outside and may be formed of silver (Ag) electrode materials.

Figure 3:
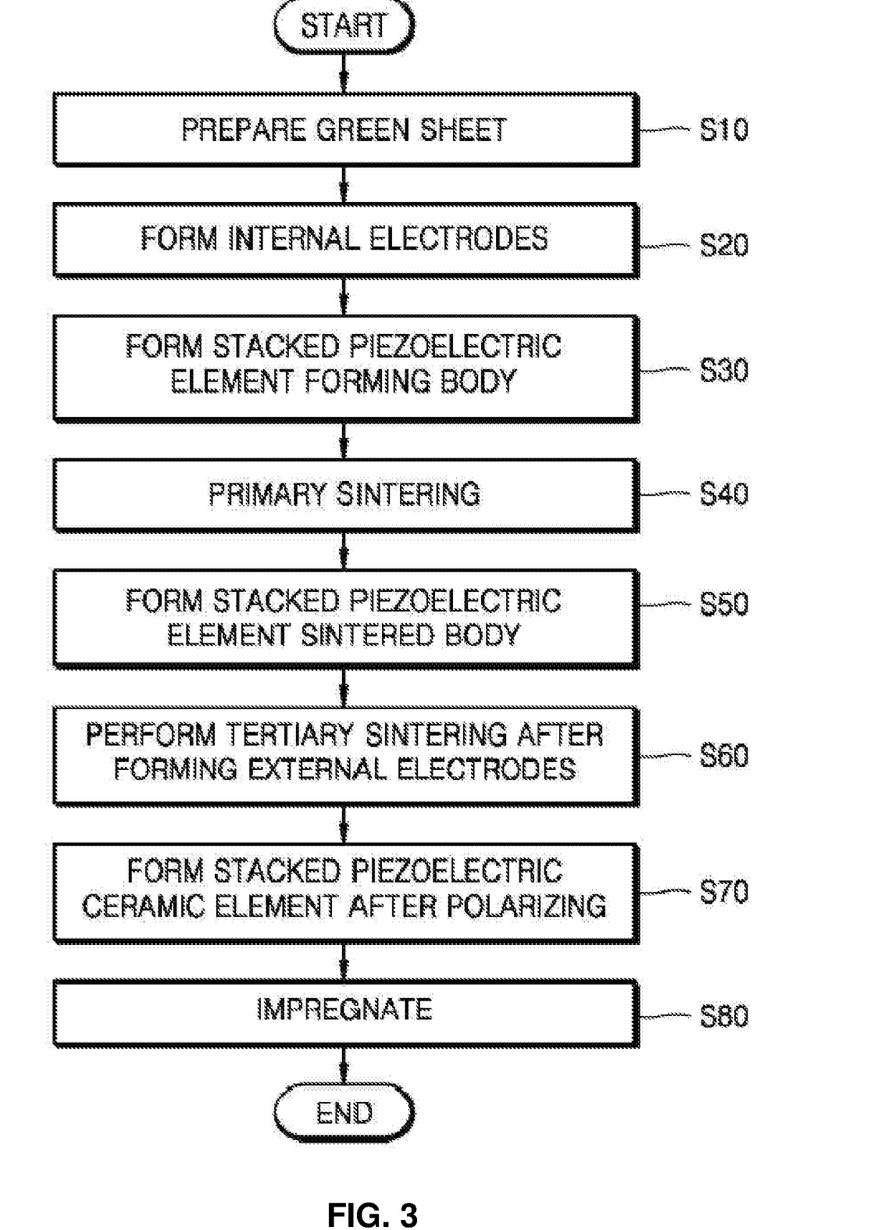
FIG. 3 is a flowchart illustrating a method of manufacturing a stacked piezoelectric ceramic element with improved waterproofing performance according to another embodiment of the present invention.
Figure 4:
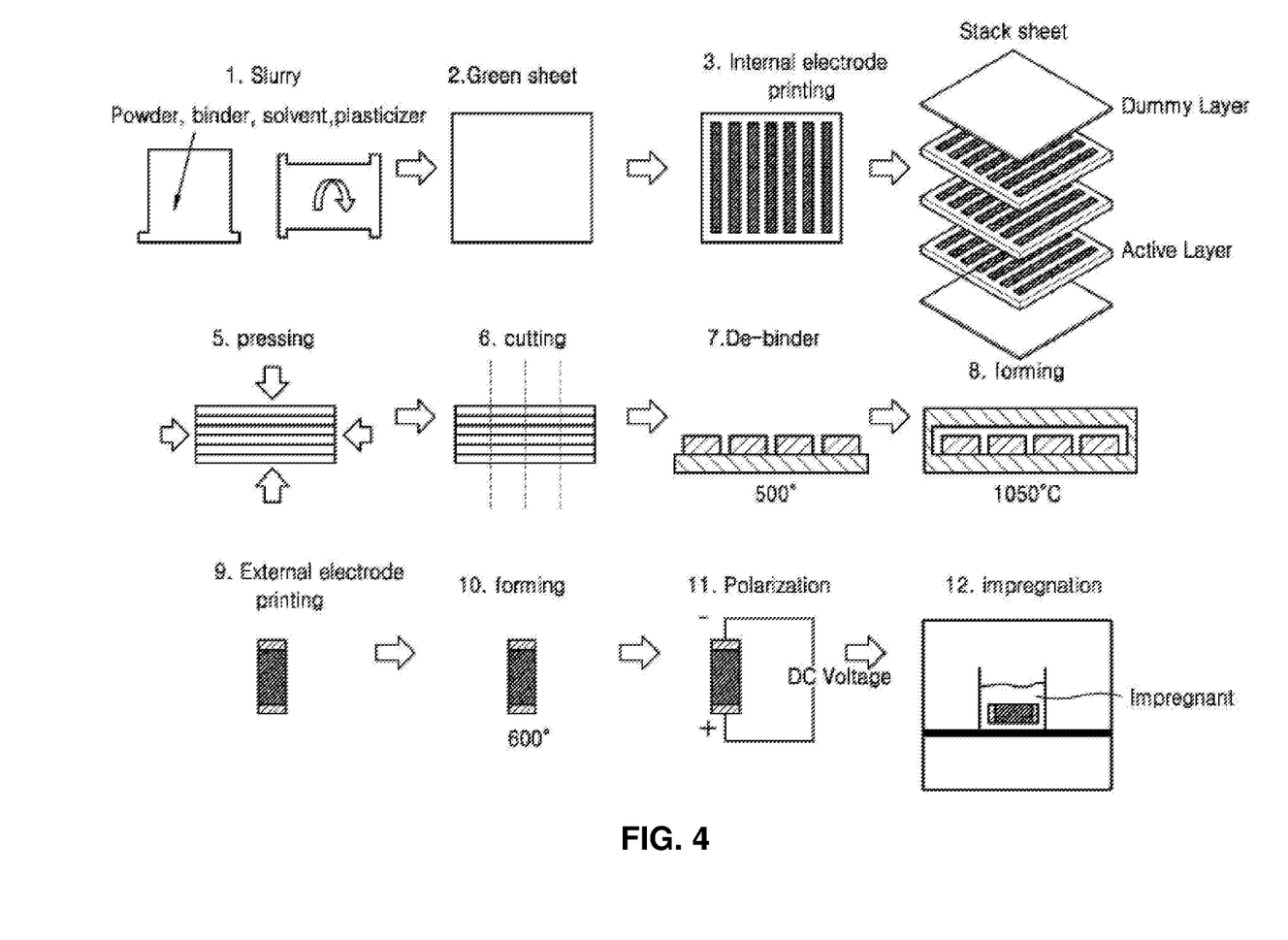
FIG. 4 is a more detailed process drawing illustrating the flowchart of FIG. 3 to apply to an experimental example of the present invention.

Meanwhile, the stacked piezoelectric ceramic element with improved waterproofing performance according to one embodiment of the present invention, as shown in FIGS. 3 and 4 described below, may have a structure in which pores of ceramic layers formed of a porous body are impregnated with an organic insulating resin solution by impregnating with the organic insulating resin solution and a waterproof-coating layer may be formed around the internal electrodes that form the actuator ceramic stack body.

Here, the organic insulating resin solution may be a silicone solution. When an organic insulating resin solution-coating layer is formed on surfaces of the plurality of dummy ceramic layers 120 and the external electrodes 130, the coating layer is removed through a sandblast process shown in FIG. 5 described below and then a diaphragm formed of one of metal, inorganic, and organic materials is coupled, thereby providing, for example, a piezoelectric speaker apparatus.

Here, since an organic insulating resin is contained in pores of the ceramic layers formed of a porous body even though the organic insulating resin solution coating layer on the surfaces of the elements are removed, deterioration of waterproofing performance may be prevented.

As described above, the stacked piezoelectric ceramic element according to the embodiment of the present invention may prevent water from penetrating the internal electrodes by impregnating an organic insulating resin solution such as silicone and deterioration of insulation resistance in a high humidity environment may be prevented due thereto.

FIG. 3 is a flowchart illustrating a method of manufacturing a stacked piezoelectric ceramic element with improved water-proofing performance according to another embodiment of the present invention.

As shown in the drawing, the method of manufacturing the stacked piezoelectric ceramic element with improved waterproofing performance according to another embodiment of the present invention may include a first operation S10 of preparing a ceramic green sheet, a second operation S20 of forming internal electrodes on the ceramic green sheet, a third operation S30 of forming a stacked piezoelectric element forming body by stacking an actuator green sheet with the internal electrodes formed thereon and inert dummy green sheet, a fourth operation S40 of performing primary sintering for a de-binding, a fifth operation S50 of performing secondary sintering of the stacked piezoelectric element forming body, a sixth operation S60 of forming external electrodes on a stacked piezoelectric element sintered body, and a seventh operation S70 of forming a stacked piezoelectric ceramic element.

In more detail, the first operation S10 is an operation of preparing an actuator ceramic green sheet and a dummy ceramic green sheet having a relatively higher sintering temperature than the actuator ceramic green sheet using two types of piezoelectric ceramic materials having different sintering temperatures and may be an operation of controlling a porosity of the piezoelectric ceramic material forming the dummy ceramic green sheet to improve waterproofing performance.

Here, the ceramic green sheet used in another embodiment of the present invention may be manufactured using a piezoelectric element slurry manufactured by mixing PZT-PNN-based piezoelectric ceramic powder, an organic solvent, a binder, a plasticizer, and a dispersant using a ball mill.

Next, the second operation S20 is an operation of forming the internal electrodes on the actuator ceramic green sheet and may be an operation of forming internal electrodes for polarization on the ceramic green sheet when the ceramic green sheet having a thickness of 30 μm to 100 μm is manufactured using the piezoelectric element slurry described above.

Next, the third operation S30 may be an operation of forming the stacked piezoelectric element forming body by arranging the dummy ceramic green sheets on an uppermost layer and a lowermost layer and arranging and compressing a plurality of such actuator ceramic green sheets with the internal electrodes therein to form a stacking structure and then cutting it at regular intervals.

Next, the fourth operation S40 may be an operation of performing primary sintering at a lower temperature than the sintering temperature of the actuator ceramic green sheet to de-bind the stacked piezoelectric element forming body.

Next, the fifth operation S50 may be an operation of forming the stacked piezoelectric element sintered body including an actuator ceramic stack body and a plurality of dummy ceramic layers that cover an upper part and a lower part of the actuator ceramic stack body and are formed of a ceramic porous body by performing secondary sintering of the stacked piezoelectric element forming body that has been primarily sintered, at the sintering temperature of the actuator ceramic green sheet.

Here, as described above, since the sintering temperature of the piezoelectric ceramic material used for manufacturing the dummy ceramic layer is higher than a sintering temperature of an actuator ceramic layer, a porosity of a ceramic porous body that forms the dummy ceramic layer may be formed to be higher than a porosity of a ceramic porous body that forms the actuator ceramic layer to improve a penetration rate of an organic insulating resin solution during an impregnation process described below.

The sixth operation S60 may be an operation of forming external electrodes on the stacked piezoelectric element sintered body that has been secondarily sintered and performing tertiary sintering at a lower temperature than the sintering temperature of the actuator ceramic green sheet. Here, according to a structure of an apparatus arranged to smoothly perform a function of receiving power applied from the outside power, the external electrodes are formed in various shapes, for example, in a perpendicular direction of a side surface of the stacked piezoelectric element to position both ends on top and bottom in the embodiment of the present invention but may be printed in various patterns as necessary.

The seventh operation S70 may be an operation of forming the stacked piezoelectric ceramic element by applying power to the external electrodes of the stacked piezoelectric element sintered body that has been tertiarily sintered.

Meanwhile, the fifth operation of the method of manufacturing the stacked piezoelectric ceramic element with improved waterproofing performance according to another embodiment of the present invention may be an operation in which the dummy ceramic layers having the porosity within a range of 0.5 to 5.0% are formed on the uppermost layer and the lowermost layer of the stacked piezoelectric element sintered body and the actuator ceramic stack body including the plurality of internal electrodes between the dummy ceramic layers and the plurality of actuator ceramic layers formed between the plurality of internal electrodes is formed.

Also, after the seventh operation S70, there may be further included an eighth operation S80 of filling pores of the ceramic layers forming the stacked piezoelectric ceramic element by impregnating the stacked piezoelectric ceramic element that has been polarized, with an organic insulating resin solution and forming a waterproof-coating layer around the internal electrodes of the actuator ceramic stack body.

In addition, as described above, after the eighth operation S80, there may be further include an operation of removing the plurality of dummy ceramic layers generated during the impregnation process and the organic insulating resin solution coating layer on the surfaces of the external electrodes through a sandblaster process.

As described above, since the method of manufacturing the stacked piezoelectric ceramic element with improved waterproofing performance according to another embodiment of the present invention is a method of forming the dummy ceramic green sheets using ceramic piezoelectric materials having the sintering temperature higher than the actuator ceramic green sheet and capable of controlling the porosity, the stacked piezoelectric ceramic element with a high moisture-proofing effect may be easily manufactured and the moisture-proofing effect may be increased by impregnating the overall stacked piezoelectric ceramic element with an organic insulating resin solution such as silicone.

Hereinafter, an effect caused by the porosity of the dummy ceramic layers forming the stacked piezoelectric ceramic element with improved waterproofing performance according to the present invention will be described in detail with reference to an experimental example.

FIG. 4 is a more detailed process drawing illustrating the flowchart of FIG. 3 to apply to the experimental example of the present invention.

Experimental Example 1

A stacked piezoelectric ceramic element forming body capable of controlling porosities of dummy ceramic layers to be 0.3%, 0.54%, 1.2%, 4.8%, and 9.3% during a sintering process (8. forming of FIG. 4) of the stacked piezoelectric element as shown in following [Table 1] was manufactured using PZT-PNN-based piezoelectric ceramic powder having a sintering temperature higher than that of the ceramic materials of the actuator ceramic layers shown in FIG. 2.

1. To manufacture the forming body, a slurry is manufactured by mixing PZT-PNN-based piezoelectric ceramic powder, an organic solvent, a binder, a plasticizer, and a dispersant using a ball mill (manufactured while distinguishing slurries for actuator ceramic and dummy ceramic having different sintering temperatures from each other).

2. Next, an actuator ceramic green sheet having a thickness of 30 μm to 100 μm and a dummy ceramic green sheet having a thickness of 20 μm are manufactured using the slurries.

3. Internal electrodes are printed on the actuator ceramic green sheet.

4. A ceramic stack structure is formed by arranging a plurality of such actuator ceramic green sheets inside and the dummy ceramic green sheet outside.

5.6. A ceramic forming body is formed by compressing and cutting the green sheets of the ceramic stack structure.

7.8. A stacked piezoelectric ceramic sintered body is obtained by de-binding the ceramic forming body at a temperature of 500° C. and putting the ceramic forming body into a sealed container to perform secondary sintering at a temperature of 1050° C. for two hours.

9.10.11. The stacked piezoelectric ceramic element shown in FIGS. 1 and 2 is obtained by printing external electrodes of Ag on the sintered body, sintering it at a temperature of 600° C., and polarizing it.

Here, in the stacked piezoelectric ceramic element, an actuator ceramic stack body formed of actuator ceramic layers with a distance between electrodes of 0.075 mm, dummy ceramic layers are installed on top and bottom of the ceramic stack body at a thickness of 20 μm as protection layers for preventing water permeation, and margins of the external electrodes are 0.15 mm.

TABLE 1

| Active layer | Dummy layer | Dummy layer porosity |
|---|---|---|
| Item1 Powder1 | Powder1 | 0.3% |
| Item2 Powder1 | Powder2 | 0.54% |
| Item3 Powder1 | Powder3 | 1.2% |
| Item4 Powder1 | Powder4 | 4.8% |
| Item5 Powder1 | Powder5 | 9.3% |

12. As an evaluand sample, the sample with the sintered external electrodes was put into a silicone solution and impregnated for 30 min in a decompressed environment close to a vacuum state to well penetrate through pores of a ceramic porous body.

A process of driving at room temperature for two hours and curing at a temperature of 130° C. for one hour was performed after the impregnation.

A change in insulation resistance was evaluated by putting the evaluand sample into an isothermal-isohumidity layer of a temperature of 85° C. and relative humidity (RH) of 95% as conditions for evaluating humidity performance and applying DC 38 V (0.5 kV/mm).

A result of <Experimental Example 1> is like following [Table 2].

TABLE 2

| | Resin impregnation | Active layer | Dummy layer | Dummy Layer porosity | IR decreased | | | |
|---|---|---|---|---|---|---|---|---|
| | | | | | 3 Hr | 10 Hr | 24 Hr | 100 Hr |
| Item 1 | ○ | Powder 1 | Powder 1 | 0.3% | 0/20 | 0/20 | 0/20 | 2/20 |
| Item 2 | ○ | Powder 1 | Powder 2 | 0.54% | 0/20 | 0/20 | 0/20 | 0/20 |
| Item 3 | ○ | Powder 1 | Powder 3 | 1.2% | 0/20 | 0/20 | 0/20 | 0/20 |

TABLE 2-continued

|  | Resin impregnation | Active layer | Dummy layer | Dummy Layer porosity | IR decreased 3 Hr | 10 Hr | 24 Hr | 100 Hr |
|---|---|---|---|---|---|---|---|---|
| Item 4 | ○ | Powder 1 | Powder 4 | 4.8% | 0/20 | 0/20 | 0/20 | 0/20 |
| Item 5 | ○ | Powder 1 | Powder 5 | 9.3% | 1/20 | 7/20 | 20/20 | — |
| Item 6 | X | Powder 1 | Powder 1 | 0.3% | 0/20 | 0/20 | 0/20 | 3/20 |
| Item 7 | X | Powder 1 | Powder 2 | 0.54% | 0/20 | 2/20 | 6/20 | 11/20 |
| Item 8 | X | Powder 1 | Powder 3 | 1.2% | 3/20 | 8/20 | 15/20 | 20/20 |
| Item 9 | X | Powder 1 | Powder 4 | 4.8% | 9/20 | 20/20 | — | — |
| Item 10 | X | Powder 1 | Powder 5 | 9.3% | 20/20 | — | — | — |

A sample not impregnated with a silicone resin had a lot of deterioration of insulation resistance (IR) as porosities of dummy ceramic layers are greater, but a sample impregnated with a silicone resin had an overall reduced repetition rate of deterioration of insulation resistance.

Also, considering a sample with deteriorated insulation resistance at 100 Hr occurred regardless of presence of resin impregnation when a porosity was 0.3% or less, it could be known that a dummy ceramic layer performed a function of a protection layer when a porosity of the dummy ceramic layer was low.

Meanwhile, it may be known that a resin impregnation effect could be obtained but was not adequate when the porosity was 9.3%. It is because pores are formed on the surface of a piezoelectric ceramic element and do not penetrate therein in the case of internal ceramic. Accordingly, since impregnation of resin is inadequate when a porosity is high, it is impossible to obtain an effect adequate for preventing deterioration of insulation resistance.

Accordingly, to suppress the deterioration of insulation resistance, it is necessary not only to impregnate with an organic insulation solution resin but also to control the porosities of the dummy ceramic layers within a range of 0.5 to 5.0%.

Figure 5:
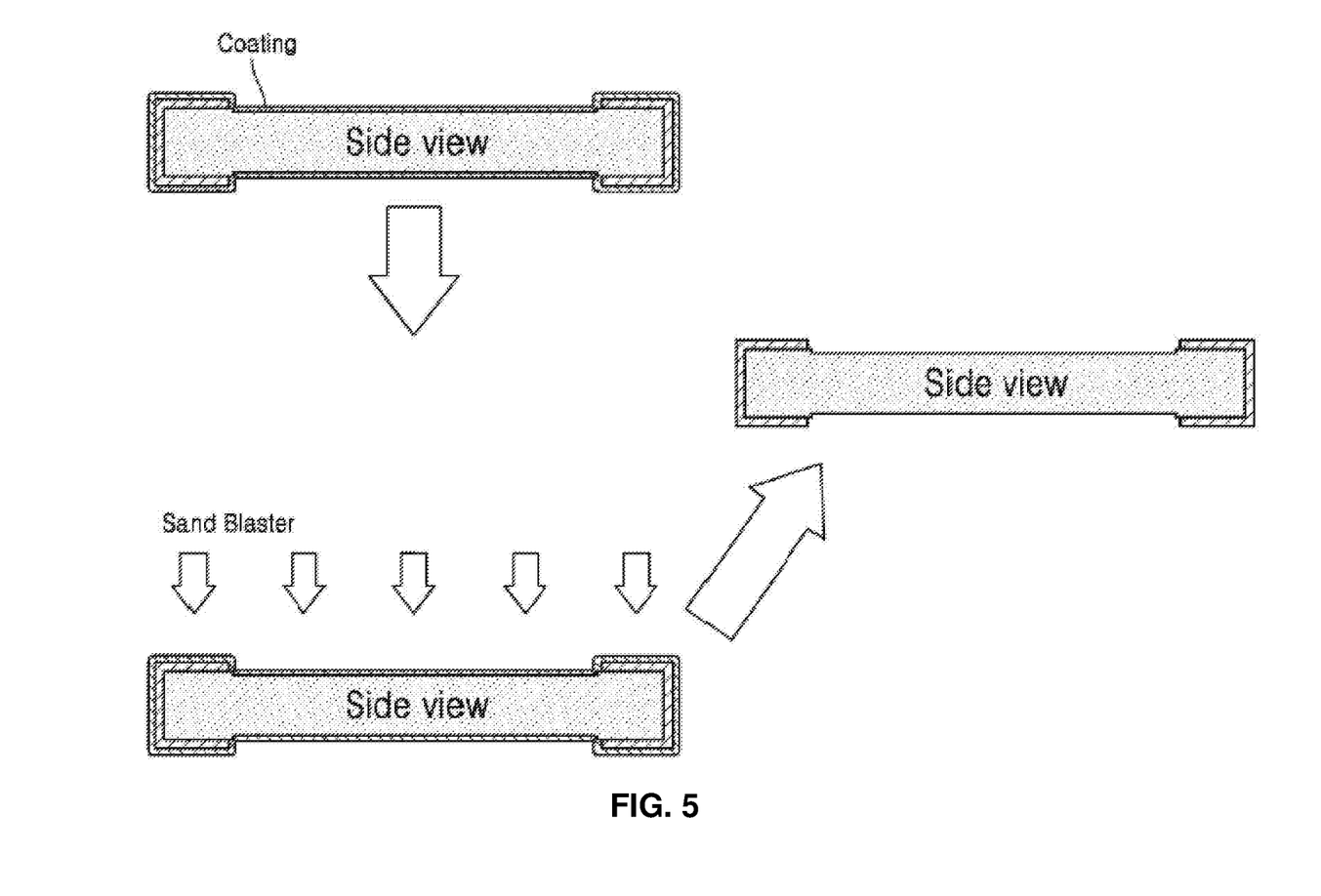
FIG. 5 is a view illustrating a process of removing a coating solution of a stacked piezoelectric ceramic element after an impregnation process shown in FIG. 4 according to an experimental example of the present invention.

FIG. 5 is a view illustrating a process of removing a coating solution of a stacked piezoelectric ceramic element (sample) after the impregnation shown in FIG. 4 according to an experimental example of the present invention.

Experimental Example 2

As shown in FIG. 5, as an experimental example, the surface of a sample that had been impregnated with a silicone resin was polished by blasting sand toward the surface using a sandblast method.

The sample with the polished surface was attached to an SUS plate that functions as a metal diaphragm using an epoxy resin and then underwent an insulation resistance deterioration experiment.

Following [Table 3] is a result of <Experimental Example 2>

Like the result shown in [Table 3], it was impossible to attach a sample with an unpolished surface after impregnating a stacked piezoelectric ceramic element to an SUS plate.

This may be because adhesion through hydrogen bond is difficult due to water repellency caused by a resin coating layer having an effect of suppressing water permeation.

Meanwhile, it could be known that a sample with a polished surface is attachable to an SUS plate and deterioration of insulation resistance was not observed also in a comparative experiment.

That is, since not only the surface of a stacked piezoelectric ceramic element (sample) is coated with a resin but also pores of ceramic layers formed of a porous body are impregnated with the resin in an impregnation process, water permeation is prevented.

As described above, according to the present invention, there is provided an effect of providing a stacked piezoelectric ceramic element capable of preventing deterioration of insulation resistance in a high humidity environment by preventing water permeation into internal electrodes using a structure in which pores forming dummy ceramic layers are impregnated with an organic insulating resin by impregnating the stacked piezoelectric ceramic element with an organic insulating resin solution such as a silicone.

Also, according to the present invention, since it is possible to control a porosity using a method of forming a dummy ceramic green sheet using ceramic piezoelectric materials having a higher sintering temperature than that of an actuator ceramic green sheet, there is provided an effect of easily manufacturing a stacked piezoelectric ceramic element having high waterproofing effect.

Also, according to the present invention, even though an inorganic insulting resin coating layer formed on the surface a stacked piezoelectric ceramic element is removed in an impregnation process thereof, since an organic insulating resin is contained in pores of a ceramic porous body forming a ceramic layer, there is an effect of providing the stacked piezoelectric ceramic element capable of easily coming into contact with a diaphragm and preventing deterioration of waterproofing performance.

TABLE 3

|  | Resin Impregnation | Resin remove | Active layer | Dummy layer | Dummy Layer porosity | Adhesion | IR decreased 3 Hr | 10 Hr | 24 Hr | 100 Hr |
|---|---|---|---|---|---|---|---|---|---|---|
| Item 1 | ○ | X | Powder 1 | Powder 1 | 0.3% | NG | 0/20 | 0/20 | 0/20 | 2/20 |
| Item 11 | ○ | ○ | Powder 1 | Powder 1 | 0.3% | OK | 0/20 | 0/20 | 0/20 | 3/20 |
| Item 12 | ○ | ○ | Powder 1 | Powder 3 | 0.54% | OK | 0/20 | 0/20 | 0/20 | 0/20 |
| Item 13 | ○ | ○ | Powder 1 | Powder 4 | 1.2% | OK | 0/20 | 0/20 | 0/20 | 0/20 |
| Item 14 | ○ | ○ | Powder 1 | Powder 5 | 4.8% | OK | 0/20 | 0/20 | 0/20 | 0/20 |

While the present invention has been described in detail, it should be obviously known that the embodiments described above are merely exemplary and not intended to be limitative and various modifications of components may be made without departing from the technical concept or field of the present invention as defined by the following claims.

What is claimed is:

1. A stacked piezoelectric ceramic element manufactured by stacking two or more ceramic green sheets, comprising a structure in which one of a pore part and a defective part of ceramic forming the stacked piezoelectric ceramic element is impregnated with an organic resin, the stacked piezoelectric ceramic element comprising:
   an actuator ceramic stack body comprising a plurality of actuator ceramic layers formed between internal electrodes or an internal electrode and an external electrode; and
   a dummy ceramic layer that covers one or more surfaces of top, bottom, and both sides of the actuator ceramic stack body,
   wherein a porosity of the dummy ceramic layer is within a range of 0.5% to 5.0% to improve waterproofing performance,
   wherein the porosity of the dummy ceramic layer is higher than a porosity of the plurality of actuator ceramic layers.

2. The stacked piezoelectric ceramic element of claim 1, having a process of removing the organic resin attached to the surface of the stacked piezoelectric ceramic element.

3. The stacked piezoelectric ceramic element of claim 1, wherein the internal electrode and the external electrode are formed of one of Ag and Ag/Pd materials.

4. The stacked piezoelectric ceramic element of claim 1, wherein the actuator ceramic layer is formed of piezoelectric ceramic material comprising PZT-based material.

5. The stacked piezoelectric ceramic element of claim 1, having a process of vacuum-impregnating or pressurization-impregnating with the organic resin.

* * * * *